(12) United States Patent
Kikuchi

(10) Patent No.: US 6,670,616 B2
(45) Date of Patent: Dec. 30, 2003

(54) ULTRAVIOLET-LIGHT IRRADIATION APPARATUS

(75) Inventor: Kenji Kikuchi, Aizuwakamatsu (JP)

(73) Assignee: Fujitsu AMD Semiconductor Limited, Aizuwakamatsu (JP)

( * ) Notice: Subject to any disclaimer, the term of this patent is extended or adjusted under 35 U.S.C. 154(b) by 0 days.

(21) Appl. No.: 10/103,557

(22) Filed: Mar. 22, 2002

(65) Prior Publication Data

US 2003/0052279 A1 Mar. 20, 2003

(30) Foreign Application Priority Data

Sep. 13, 2001 (JP) .......................... 2001-278591

(51) Int. Cl.[7] .................. G01J 23/00; H01K 1/58; H01K 3/22
(52) U.S. Cl. .................. 250/455.11; 250/494.1; 250/504 R; 313/114; 313/11; 313/12
(58) Field of Search .................. 250/455.11, 467.1, 250/494.1, 496.1, 503.1, 504 R; 313/113, 114, 115, 11, 12, 22, 23, 35, 36, 46; 362/341, 296

(56) References Cited

U.S. PATENT DOCUMENTS

| | | | | |
|---|---|---|---|---|
| 4,786,812 A | * | 11/1988 | Humphreys | 250/455.11 |
| 4,839,513 A | * | 6/1989 | Wijtsma | 607/94 |
| 4,883,571 A | * | 11/1989 | Kondo et al. | 204/478 |
| 6,140,659 A | * | 10/2000 | Shizuka | 250/504 R |
| 6,280,060 B1 | * | 8/2001 | Suzuki et al. | 362/294 |

FOREIGN PATENT DOCUMENTS

| | | | | |
|---|---|---|---|---|
| JP | 5-21873 | 1/1993 | | |
| JP | 7-335016 | 12/1995 | | |
| JP | 07-335016 | * 12/1995 | | F21V/29/00 |
| JP | 9-80959 | 3/1997 | | |
| JP | 11-329023 | * 11/1999 | | F21Q/3/00 |
| JP | 2001-13307 | 1/2001 | | |

* cited by examiner

Primary Examiner—John R. Lee
Assistant Examiner—James P. Hughes
(74) Attorney, Agent, or Firm—Westerman, Hattori, Daniels & Adrian, LLP

(57) ABSTRACT

Irradiation lamps of an ultraviolet-light irradiation apparatus are uniformly cooled to achieve an appropriate temperature of the walls of the lamps and the ultraviolet light emitted from the lamps is efficiently reflected toward an object to be irradiated so that the ultraviolet light is efficiently irradiated onto the object to be irradiated. A plurality of low-pressure mercury lamps are arranged in parallel. A reflective mirror is arranged above the low-pressure mercury lamps so as to reflect the ultraviolet light emitted by the low-pressure mercury lamps. An exhaust passage defined by the reflective mirror suctions air around the low-pressure mercury lamps and exhausts the suctioned air to outside. The reflective mirror has a plurality of openings arranged along a longitudinal direction of the low-pressure mercury lamps, and a part of the openings has a size different from a size of other parts of the openings.

21 Claims, 9 Drawing Sheets

ULTRAVIOLET-LIGHT IRRADIATION APPARATUS

BACKGROUND OF THE INVENTION

1. Field of the Invention

The present invention generally relates to ultraviolet-light irradiation apparatuses and, more particularly, to an ultraviolet-light irradiation apparatus for eliminating an electric charge after various plasma processes in a semiconductor manufacturing process.

In a manufacturing process of a flash memory, irradiation of an ultraviolet-light by a low-pressure mercury lamp is widely used in a process of eliminating an electric charge after carrying out a plasma process such as an etching process. That is, an electric charge of a semiconductor wafer is eliminated by irradiating an ultraviolet light onto the semiconductor wafer. The low-pressure mercury lamp used for such a process is a consumable component part, and it is required to replace the low-pressure mercury lamp with new one since an illumination intensity will become below a specified value when certain hours of use has passed. Therefore, there is a demand for reducing a cost for replacing a low-pressure mercury lamp. Moreover, the is a demand for improving productivity by improving an irradiation efficiency of a low-pressure mercury lamp so as to reduce an irradiation time.

2. Description of the Related Art

FIG. 1 is an illustrative cross-sectional view of a conventional ultraviolet-light irradiation apparatus 1 used for eliminating an electric charge of semiconductor wafers. FIG. 2 is a side view of the ultraviolet-light irradiation apparatus 1 shown in FIG. 1. The ultraviolet-light irradiation apparatus 1 comprises a wafer support plate 2 as a placement stage provided in a housing and a plurality of low-pressure mercury lamps 4 provided above the wafer support plate 2. The low-pressure mercury lamp 4 emits an ultraviolet light having a wave length of 254 nm, and irradiates the ultraviolet light onto a wafer W placed on the wafer support plate 2.

An electric charge of the wafer W is eliminated by the irradiation of the ultraviolet light. A reflective mirror 3 is provided above the low-pressure mercury lamps 4. The reflective mirror 3 reflects the ultraviolet light, which is emitted upward by the low-pressure mercury lamps 4, so that the ultraviolet light is irradiated onto the wafer W as much as possible. Moreover, a reflective mirror 5 is also provided on each side of the low-pressure mercury lamps 4.

FIG. 3 is a plan view of the reflective mirror 3 viewed from the reflective surface side. The reflective mirror 3 is formed as a bottom surface of an exhaust passage 7, and is provided with may exhaust holes 3a, which are small holes or openings, as shown in FIG. 3. An end (right-hand side of FIG. 2) of the exhaust passage 7, which has the reflective mirror 3 as a bottom surface, is closed, and air is suctioned through the other end (left-hand side of FIG. 2) of the exhaust passage 7. Therefore, air heated by a temperature rise of the tube walls of the low-pressure mercury lamps 4 is suctioned into the exhaust passage 7 through the exhaust holes 3a, and is exhausted to an exterior of the ultraviolet-light irradiation apparatus 1.

Accordingly, the hot air around the low-pressure mercury lamps 4 is exhausted so that the temperature of the tube walls of the low-pressure mercury lamps 4 is prevented from rising excessively. Moreover, a water-cooling mechanism 9 is provided above the exhaust passage 7 so as to cool the ultraviolet-light irradiation apparatus 1 including the low-pressure mercury lamps 4, which also prevents an excessive temperature rise.

The exhaust holes 3a shown in FIG. 3 are circular pores having a diameter of 10 mm, and are arranged along a longitudinal direction of the low-pressure mercury lamps 4. As mentioned above, since air is suctioned through one end of the exhaust passage 7 and exhausted from the other end, a pressure difference is generated between the opposite ends of the exhaust passage 7, which causes deviation in an amount of air suctioned through the exhaust holes 3a.

That is, an amount of air suctioned through the exhaust holes 3a near the suction side (left-hand side of FIG. 2) is larger than an amount of air suctioned through the exhaust holes 3a near the opposite side (right-hand side of FIG. 2). If an amount of exhaust air passing through the exhaust passage 7 is adjusted so as to set a temperature of the low-pressure mercury lamps 4 at the side opposite to the suction side to an appropriate temperature, the low-pressure mercury lamps 4 near the suction side are excessively cooled, which prevents the whole low-pressure mercury lamps 4 from being uniformly cooled.

Thus, there is a problem in that an excessively cooled potion is formed in the tube walls of the low-pressure mercury lamp 4, which reduces the irradiation efficiency. Moreover, the reflective surface of the reflective mirror 3 shown in FIG. 3 has mere a flat surface configuration, and the reflective efficiency is not taken into consideration. That is, as indicated by an arrow in FIG. 1, an ultraviolet light projected from an upper part of the low-pressure ultraviolet light 4 is reflected in a direction other than a direction toward the wafer W or irradiated onto a side of the apparatus without reflection. Thus, the consideration for turning an ultraviolet light in the direction of wafer W efficiently is not made with respect to the reflective mirror 3 which has the reflective surface of a mere flat-surface configuration, and there is a problem in that efficient ultraviolet-light irradiation is not performed.

SUMMARY OF THE INVENTION

It is a general object of the present invention to provide an improved and useful ultraviolet-light irradiation apparatus in which the above-mentioned problems are eliminated.

A more specific object of the present invention is to provide an ultraviolet-light irradiation apparatus in which irradiation lamps are uniformly cooled to achieve an appropriate temperature of the walls of the lamps and the ultraviolet light emitted from the lamps is efficiently reflected toward an object to be irradiated so that the ultraviolet light is efficiently irradiated onto the object to be irradiated.

In order to achieve the above-mentioned objects, there is provided according to one aspect of the present invention an ultraviolet-light irradiation apparatus comprising: a plurality of low-pressure mercury lamps arranged in parallel; a placement stage provided under the low-pressure mercury lamps so that an object onto which an ultraviolet light emitted by the low-pressure mercury lamps is irradiated is placed on the placement stage; a reflective mirror arranged above the low-pressure mercury lamps so as to reflect the ultraviolet light emitted by the low-pressure mercury lamps; and an exhaust passage defined by the reflective mirror, the exhaust passage suctioning air around the low-pressure mercury lamps and exhausting the suctioned air to outside, wherein the reflective mirror has a plurality of openings arranged along a longitudinal direction of the low-pressure mercury lamps, and a part of the openings has a size different from a size of other parts of the openings.

According to the above-mentioned invention, an amount of air suctioned through the reflective mirror can be locally changed along the longitudinal direction of the low-pressure mercury lamps so as to adjust a degree of cooling partially. Therefore, when variation arises in a cooling effect along the longitudinal direction of the low-pressure mercury lamps, a uniform cooling effect can be acquired by locally changing a size of a part of the openings. Thus, a bulb temperature of the low-pressure mercury lamps can be uniformized, which extends the service life of the low-pressure mercury lamps.

In the ultraviolet-light irradiation apparatus according to the present invention, the exhaust passage may have a closed end and a suction end opposite to the closed end along a longitudinal direction thereof so as to suction air through the opening by exhausting the air from the suction end, and the size of the openings may gradually increase from the suction end toward the closed end of the exhaust passage.

The reflective mirror may be divided into a plurality of areas along the longitudinal direction of the low-pressure mercury lamps, and the openings located in one of the adjacent areas closer to the closed end of the exhaust passage may be larger than the other area closer to the suction end of the exhaust passage. An interval of the openings may locally differ along the longitudinal direction of the low-pressure mercury lamps.

Additionally, there is provided according to another aspect of the present invention an ultraviolet-light irradiation apparatus comprising: a plurality of low-pressure mercury lamps arranged in parallel; a placement stage provided under the low-pressure mercury lamps so that an object onto which an ultraviolet light emitted by the low-pressure mercury lamps is irradiated is placed on the placement stage; a reflective mirror arranged above the low-pressure mercury lamps so as to reflect the ultraviolet light emitted by the low-pressure mercury lamps; and an exhaust passage defined by the reflective mirror, the exhaust passage suctioning air around the low-pressure mercury lamps and exhausting the suctioned air to outside, wherein the reflective mirror has a plurality of openings having the same size and arranged along a longitudinal direction of the low-pressure mercury lamps, and an interval of the openings locally differs along the longitudinal direction of the low-pressure mercury lamps.

According to the above-mentioned invention, a density of openings can be locally changed by locally changing the interval of the openings, thereby locally changing an amount of air suctioned through the reflective mirror. Therefore, a bulb temperature can be adjusted along the longitudinal direction of the low-pressure mercury lamps. Thus, when variation occurs in the cooling effect along the longitudinal direction of the low-pressure mercury lamps, a uniform cooling effect can be acquired by locally changing the interval of the openings of the reflective mirror. Thereby, the bulb temperature of the low-pressure mercury lamps can be unifromized, which results in improvement of the service life of the low-pressure mercury lamps.

Additionally, there is provided according to another aspect of the present invention an ultraviolet-light irradiation apparatus comprising: a plurality of low-pressure mercury lamps arranged in parallel; a placement stage provided under the low-pressure mercury lamps so that an object onto which an ultraviolet light emitted by the low-pressure mercury lamps is irradiated is placed on the placement stage; and a reflective mirror arranged above the low-pressure mercury lamps so as to reflect the ultraviolet light emitted by the low-pressure mercury lamps, wherein the reflective mirror has a protruding reflective part protruding into a space between the adjacent low-pressure mercury lamps.

According to the above-mentioned invention, the ultraviolet light emitted by the low-pressure mercury lamps can be efficiently reflected toward the object to be irradiated by the protruding reflective part. Thus, the illuminance of the ultraviolet-light on the object to be irradiated in the area between the adjacent low-pressure mercury lamps can be increased as compared with a reflective mirror, which does not have a projection reflective part. Thereby, the illuminance of the ultraviolet light on the object to be irradiated is uniformaized over the entire surface of the object, and a high-quality process can be performed on the object to be irradiated.

In the ultraviolet-light irradiation apparatus according to the above-mentioned invention, the protruding reflective part of the reflective mirror may have an outer configuration defined by two sides of a triangle having a top located in the middle between the adjacent low-pressure mercury lamps. The reflective mirror may be made of a metal plate, and the protruding reflective part is formed by bending the metal plate.

The ultraviolet-light irradiation apparatus may further comprise an exhaust passage defined by the reflective mirror, the exhaust passage suctioning air around the low-pressure mercury lamps and exhausting the suctioned air to outside, wherein the reflective mirror may have a plurality of openings having the same size and arranged along a longitudinal direction of the low-pressure mercury lamps, and the exhaust passage may have a closed end and a suction end opposite to the closed end along a longitudinal direction thereof so as to suction air through the opening by exhausting the air from the suction end, the size of the openings gradually increasing from the suction end toward the closed end of the exhaust passage.

The reflective mirror may be divided into a plurality of areas along the longitudinal direction of the low-pressure mercury lamps, and the openings located in one of the adjacent areas closer to the closed end of the exhaust passage may be larger than the other area closer to the suction end of the exhaust passage.

The ultraviolet-light irradiation apparatus according to the present invention may be configured and arranged to irradiate the ultraviolet light onto the object to be irradiated so as to cure a resist applied to the object to be irradiated. Or, the ultraviolet-light irradiation apparatus may be configured and arranged to irradiate the ultraviolet light onto the object to be irradiated so as to carry out optical cleaning of an organic matter on the object to be irradiated.

Additionally, there is provided according to another aspect of the present invention a resist curing method comprising: generating an ultraviolet light by a plurality of low-pressure mercury lamps arranged in parallel; reflecting the ultraviolet light emitted by the low-pressure mercury lamps toward an object placed on a placement stage by a reflective mirror located above the low-pressure mercury lamps so as to cure a resist on the object to be irradiated; and suctioning air around the low-pressure mercury lamps into an exhaust passage defined by the reflective mirror and exhausting the suctioned air to outside, the air being suctioned through a plurality of openings formed in the reflective mirror and arranged along a longitudinal direction of the low-pressure mercury lamps, a part of the openings having a size different from a size of other parts of the openings.

Additionally, there is provided according to another aspect of the present invention a resist curing method comprising: generating an ultraviolet light by a plurality of low-pressure mercury lamps arranged in parallel; reflecting the ultraviolet light emitted by the low-pressure mercury lamps toward an object placed on a placement stage by a reflective mirror located above the low-pressure mercury lamps so as to cure a resist on the object to be irradiated; suctioning air around the low-pressure mercury lamps into an exhaust passage defined by the reflective mirror and exhausting the suctioned air to outside, the air being suctioned through a plurality of openings having the same size and formed in the reflective mirror and arranged along a longitudinal direction of the low-pressure mercury lamps, an interval of the openings locally differing along the longitudinal direction of the low-pressure mercury lamps.

Additionally, there is provided according to another aspect of the present invention a resist curing method, comprising: generating an ultraviolet light by a plurality of low-pressure mercury lamps arranged in parallel; and reflecting the ultraviolet light emitted by the low-pressure mercury lamps toward an object placed on a placement stage by a protruding reflective part of a reflective mirror so as to cure a resist on the object to be irradiated, the protruding reflective part protruding into a space between the adjacent low-pressure mercury lamps.

Additionally, there is provided according to another aspect of the present invention an optical cleaning method of an organic matter, comprising: generating an ultraviolet light by a plurality of low-pressure mercury lamps arranged in parallel; reflecting the ultraviolet light emitted by the low-pressure mercury lamps toward an object placed on a placement stage by a reflective mirror located above the low-pressure mercury lamps so as to optically remove the organic matter on the object to be irradiated; and suctioning air around the low-pressure mercury lamps into an exhaust passage defined by the reflective mirror and exhausting the suctioned air to outside, the air being suctioned through a plurality of openings formed in the reflective mirror and arranged along a longitudinal direction of the low-pressure mercury lamps, a part of the openings having a size different from a size of other parts of the openings.

Additionally, there is provided according to another aspect of the present invention an optical cleaning method of an organic matter, comprising: generating an ultraviolet light by a plurality of low-pressure mercury lamps arranged in parallel; reflecting the ultraviolet light emitted by the low-pressure mercury lamps toward an object placed on a placement stage by a reflective mirror located above the low-pressure mercury lamps so as to optically remove the organic matter on the object to be irradiated; and suctioning air around the low-pressure mercury lamps into an exhaust passage defined by the reflective mirror and exhausting the suctioned air to outside, the air being suctioned through a plurality of openings having the same size and formed in the reflective mirror and arranged along a longitudinal direction of the low-pressure mercury lamps, an interval of the openings locally differing along the longitudinal direction of the low-pressure mercury lamps.

Further, there is provided according to another aspect of the present invention an optical cleaning method of an organic matter, comprising: generating an ultraviolet light by a plurality of low-pressure mercury lamps arranged in parallel; and reflecting the ultraviolet light emitted by the low-pressure mercury lamps toward an object placed on a placement stage by a protruding reflective part of a reflective mirror so as to optically remove the organic matter on the object to be irradiated, the protruding reflective part protruding into a space between the adjacent low-pressure mercury lamps.

Other objects, features and advantages of the present invention will become more apparent from the following detailed description when read in conjunction with accompanying drawings.

DETAILED DESCRIPTION OF THE PREFERRED EMBODIMENT

Figure 4:
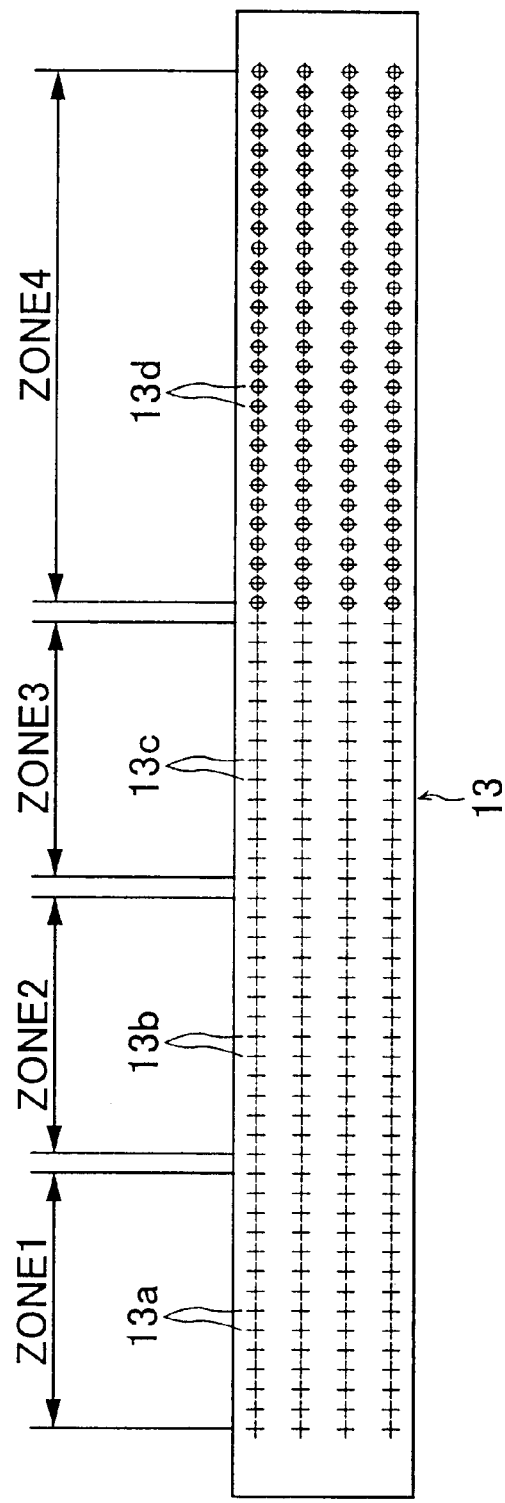
FIG. 4 is a plan view of a reflective mirror provided in an ultraviolet-light irradiation apparatus according to a first embodiment of the present invention.

A description will now be given of a first embodiment of the present invention. FIG. 4 is a plan view of a reflective mirror provided in an ultraviolet-light irradiation apparatus according to the first embodiment of the present invention.

Figure 1:
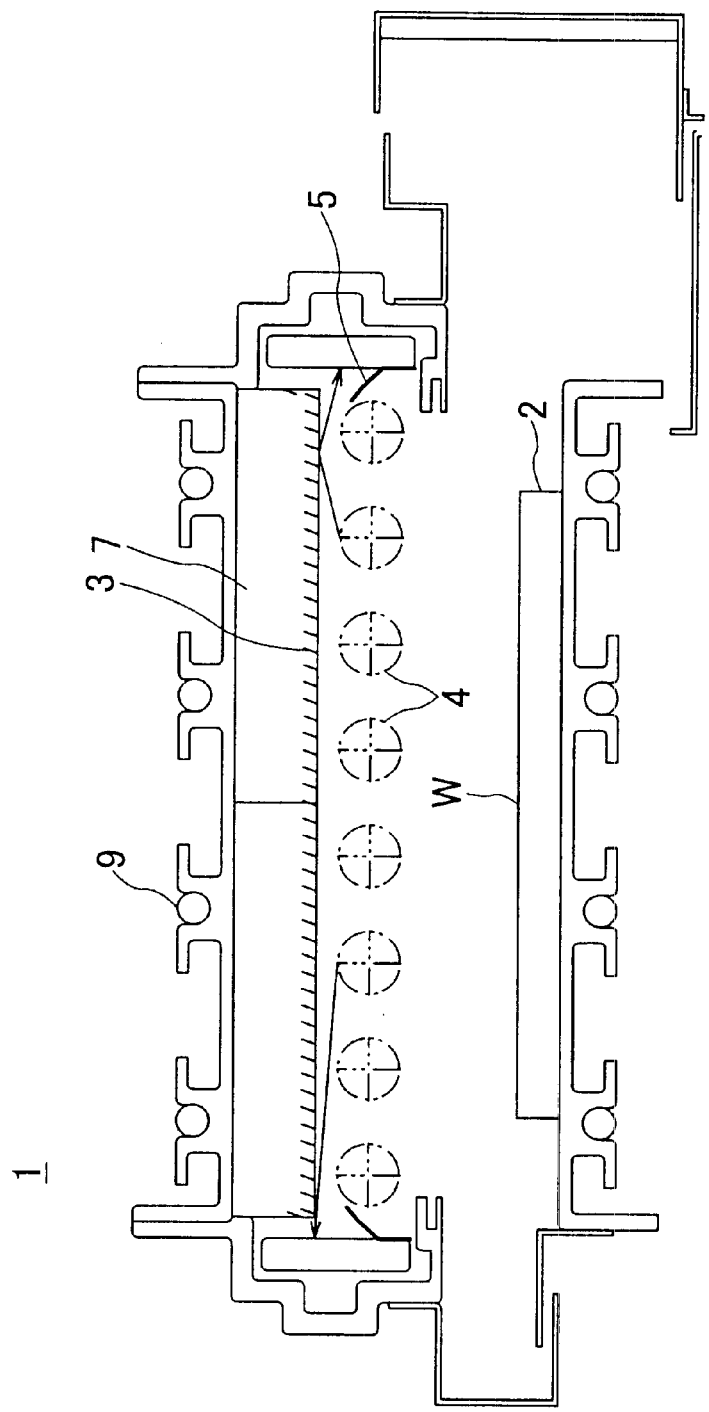
FIG. 1 is an illustrative cross-sectional view of a conventional ultraviolet-light irradiation apparatus used for eliminating an electric charge of semiconductor wafers.
Figure 2:
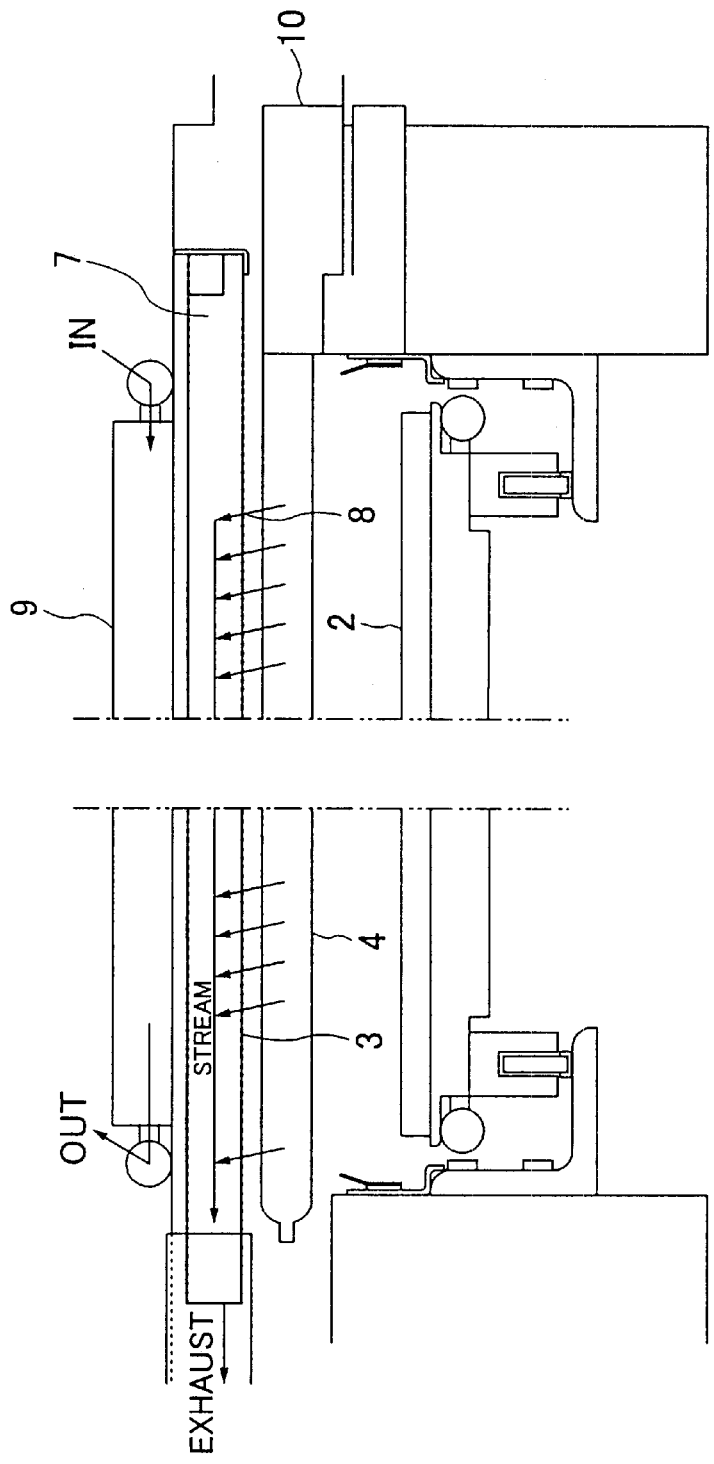
FIG. 2 is a side view of the ultraviolet-light irradiation apparatus shown in FIG. 1.
Figure 3:
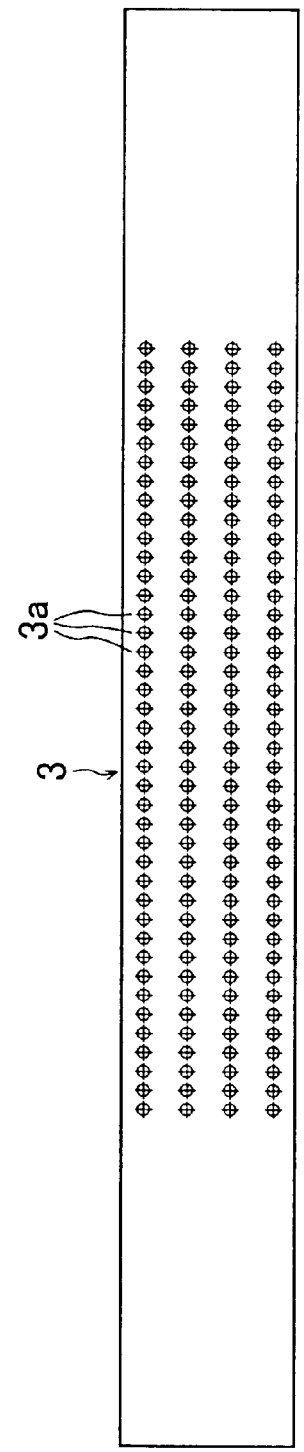
FIG. 3 is a plan view of a reflective mirror viewed from a reflective surface side.

The ultraviolet-light irradiation apparatus according to the first embodiment of the present invention has the same structure as the ultraviolet-light irradiation apparatus shown in FIG. 1 except for the reflective mirror 3 shown in FIG. 3 being replaced by a reflective mirror 13 shown in FIG. 4. Since the structure other than the reflective mirror is the same as the structure shown in FIG. 1 and FIG. 2, descriptions thereof will be omitted. In the ultraviolet-light irradiation apparatus according to the first embodiment of the present invention, air around the low-pressure mercury lamps 4 is suctioned along its longitudinal direction by sequentially changing the size of the exhaust holes formed in the reflective mirror along the stream line of the exhaust air in the exhaust passage 7.

That is, as shown in FIG. 4, in the reflective mirror 13 according to the present embodiment, an area in which the exhaust holes (pores) are provided is divided into a plurality of zones. In the present embodiment, the area is divided into four zones 1 though 4, and the size of the exhaust holes differs on an individual zone basis. More specifically, exhaust holes 13a having a diameter of 3 mm are formed in the zone 1, which is closest to the suction side of the exhaust passage 7. Exhaust holes 13b having a diameter of 3.6 mm are formed in the zone 2 next closest to the suction side. The zone 3 is provided with exhaust holes 13c having a diameter of 4 mm. The zone 4, which is farthest from the suction side, is provided with exhaust holes 13d having a diameter of 6.8 mm. In the present embodiment, the exhaust holes 13a, 13b, 13c and 13d are arranged at an equal pitch.

Thus, by sequentially increasing the size of the exhaust holes along the exhaust passage 7 from the suction side to the opposite side, an amount of suction air is regulated on the suction side where a suction pressure force is large and an amount of suction air is increased on the opposite side where the suction pressure suction the amount of suction is controlled in a suction side with a large suction pressure, and the amount of suction is increased by the opposite side to which a suction pressure is small. Therefore, the air heated by the low-pressure mercury lamps 4 can be uniformly suctioned along the longitudinal direction of the low-pressure mercury lamps 4, and the suctioned heated air can be exhausted from the apparatus.

Figure 5:
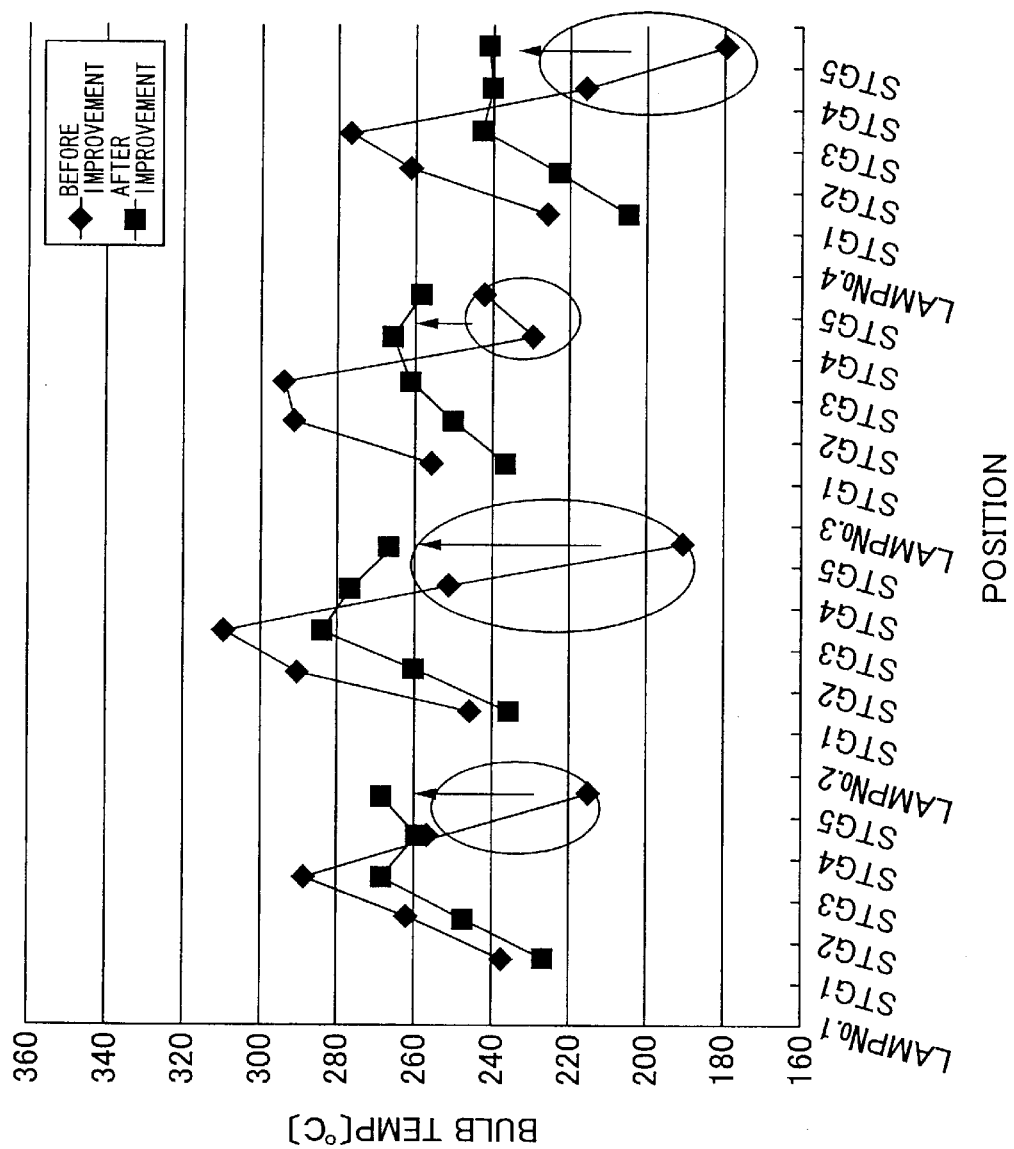
FIG. 5 is a graph showing temperatures of the tube wall of a low-pressure mercury lamp when a conventional reflective mirror and a reflective mirror having exhaust holes shown in FIG. 4 are used.

FIG. 5 is a graph showing temperatures of the tube wall of the low-pressure mercury lamp 4 when the conventional reflective mirror and the reflective mirror having exhaust holes shown in FIG. 4 are used. In the graph of FIG. 5, the bulb temperature of four low-pressure mercury lamps 4 (lamps No. 1–4) arranged in parallel is indicated, and the bulb temperature of positions corresponding to stage 1 (STG1) through stage 5 (STG5) is shown for each of the lamps. Here, the stage 1 through stage 5 correspond to the wafer support plates which area arranged along the longitudinal direction of the low-pressure mercury lamps 4. The stage 1 is located closest to the suction side of the exhaust passage 7, and the stage 5 is located farthest to the suction side. Moreover, diamond dots show the result of measurement of the bulb-temperature when the conventional reflective mirror having the same size exhaust holes shown in FIG. 3 is used, and square dots show the result of measurement of the bulb-temperature after improvement, that is, when the reflective mirror having the exhaust holes shown in FIG. 4 is used.

As shown in FIG. 5, although the bulb temperature of the parts corresponding to the locations of stages 4 and 5 were lower than other portions in each of the lamps No. 1 through No. 4 when the conventional reflective mirror (before improvement) was used, the bulb temperature of the parts corresponding to the locations of stages 4 and 5 was raised and the bulb temperature of the parts corresponding to the stages 1 though 3 was lowered when the reflective mirror after the improvement was used. Therefore, when the reflective mirror after the improvement is used, the bulb temperature is uniformized along the longitudinal direction of the lamp 4, as compared with the case where the reflective mirror before the improvement is used. Thereby, a uniform temperature distribution along the longitudinal direction of the low-pressure mercury lamp 4 can be obtained, and an ultraviolet light of a uniform intensity can be irradiated along the longitudinal direction of the low-pressure mercury lamp 4.

Moreover, there is an effect that the service life of the low-pressure mercury lamp 4 is extended due to the bulb temperature being uniformized. That is, it is known that generally the service-life of the low-pressure mercury lamp 4 depends on generation of oxygen due to scattering and emitter decomposition of an emitter of a cathode, generation of mercury oxide, decrease in a transmission rate of the luminescent tube, and variation of initial intensity of illumination. The bulb temperature of the lamp is one of the important parameters which influence the service life of the low-pressure mercury lamp 4. Therefore, by uniformizing the bulb temperature, local degradation of the service life can be eliminated, which results in extension of the service life of the low-pressure mercury lamp 4.

It should be noted that, in the graph of FIG. 5, the bulb temperature of the part corresponding to the center stage 3 is high, which is caused by the fact that heat is released easier from the end portions of the lamp than the center portion of the lamp. Moreover, although slight changes are observed in the temperature along the longitudinal direction of the low-pressure mercury lamp 4 even when the improved reflective mirror is used, a further uniformized temperature distribution can be achieved by locally changing the size or interval of the exhaust holes.

A partial change in the pitch of the exhaust holes partially is equivalent to a partial change in the density of the exhaust holes. Thereby, an amount of air suctioned through the reflective mirror 13 can be adjusted along the longitudinal direction of the low-pressure mercury lamps 4, which provides the same effect that is provided by changing the exhaust holes. However, increasing kind and size of the exhaust holes and reducing the pitch of the exhaust holes cause an increase in the fabrication cost of the reflective mirror, and the structure of the exhaust holes shown in FIG. 4 is sufficient in practical use.

The above-mentioned reflective mirror 13 can be easily fabricated by thin plate working of a metal plate. That is, the reflective mirror can be easily fabricated by processing the reflective surface side of a metal plate to have a high reflectivity by a plating process or the like and punching the exhaust holes by a press work or the like. By dividing the reflective mirror 13 into a plurality of areas, and making the exhaust holes to have the same size in the same area, the number of kinds of punching dies can be reduced, which facilitates the fabrication of the reflective mirror.

Figure 6:
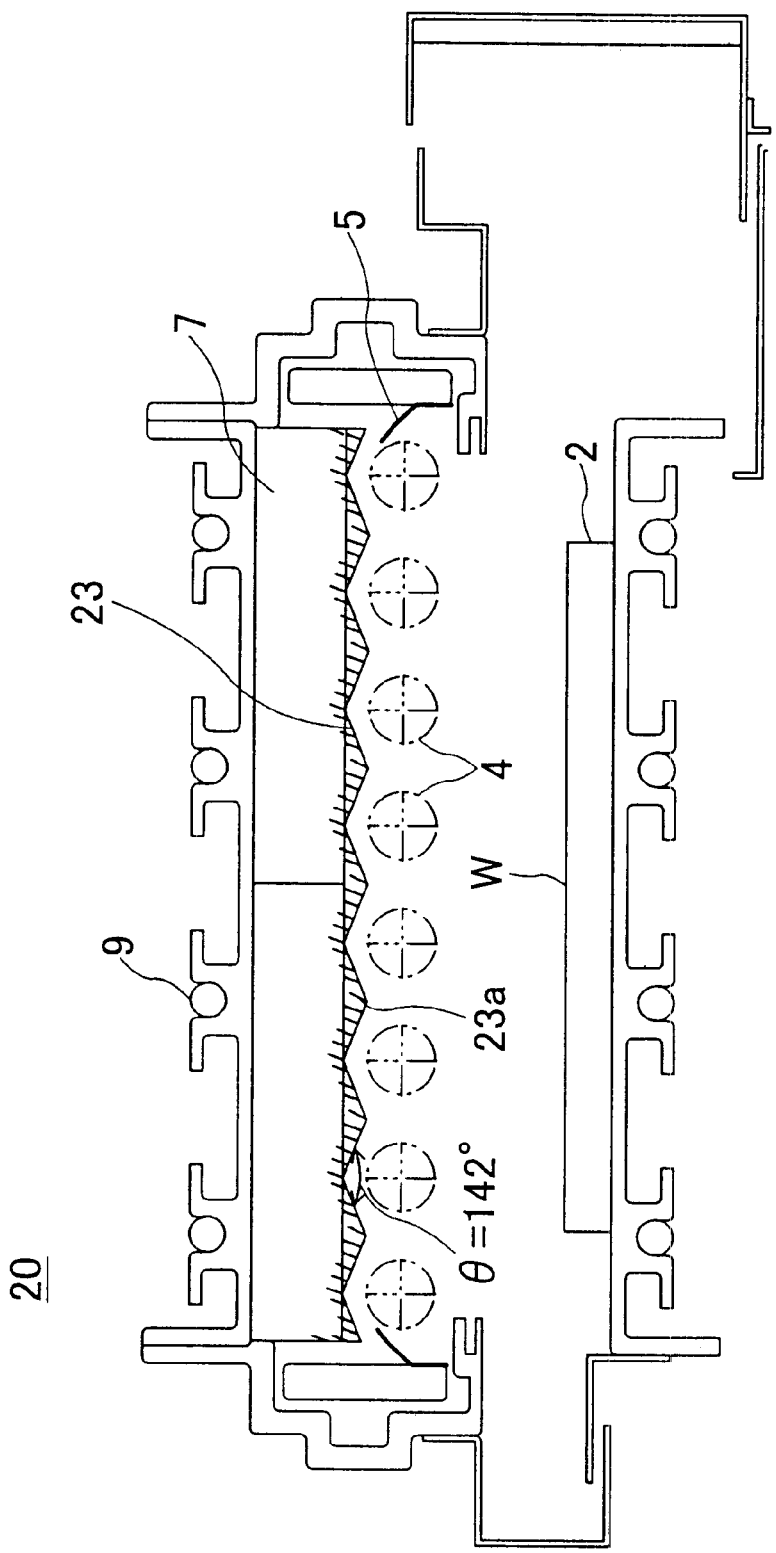
FIG. 6 is an illustrative cross-sectional view of an ultraviolet-light irradiation apparatus according to a second embodiment of the present invention.

A description will now be given, with reference to FIG. 6, of an ultraviolet-light irradiation apparatus according to a second embodiment of the present invention. FIG. 6 is an illustrative cross-sectional view of the ultraviolet-light irradiation apparatus 20 according to the second embodiment of the present invention.

The ultraviolet-light irradiation apparatus 20 according to the second embodiment of the present invention has the same structure as the ultraviolet-light irradiation apparatus 1 shown in FIG. 1 except for the reflective mirror 3 being replaced by a reflective mirror 23. In FIG. 6, parts that are the same as the parts shown in FIG. 1 area given the same reference numerals, and descriptions thereof will be omitted.

As shown in FIG. 6, the reflective mirror 23 according to the present embodiment is provided with protruding reflective parts 23a, each of which protrudes into a space between adjacent low-pressure mercury lamps 4. The reflective mirror 23 can be easily formed by bending a metal plate in a continued chevron shape (or a corrugated form) by press working or the like.

The top of each of the protruding reflective parts 23a of the reflective mirror 23 is located in the middle between the adjacent lamps 4, and each lamp 4 is arranged in a groove part of the reflective mirror 23. Therefore, the ultraviolet light irradiated from each low-pressure mercury lamp 4 is efficiently reflected in the direction toward the wafer W by the slanting parts of the reflective part 23a.

Figure 7:
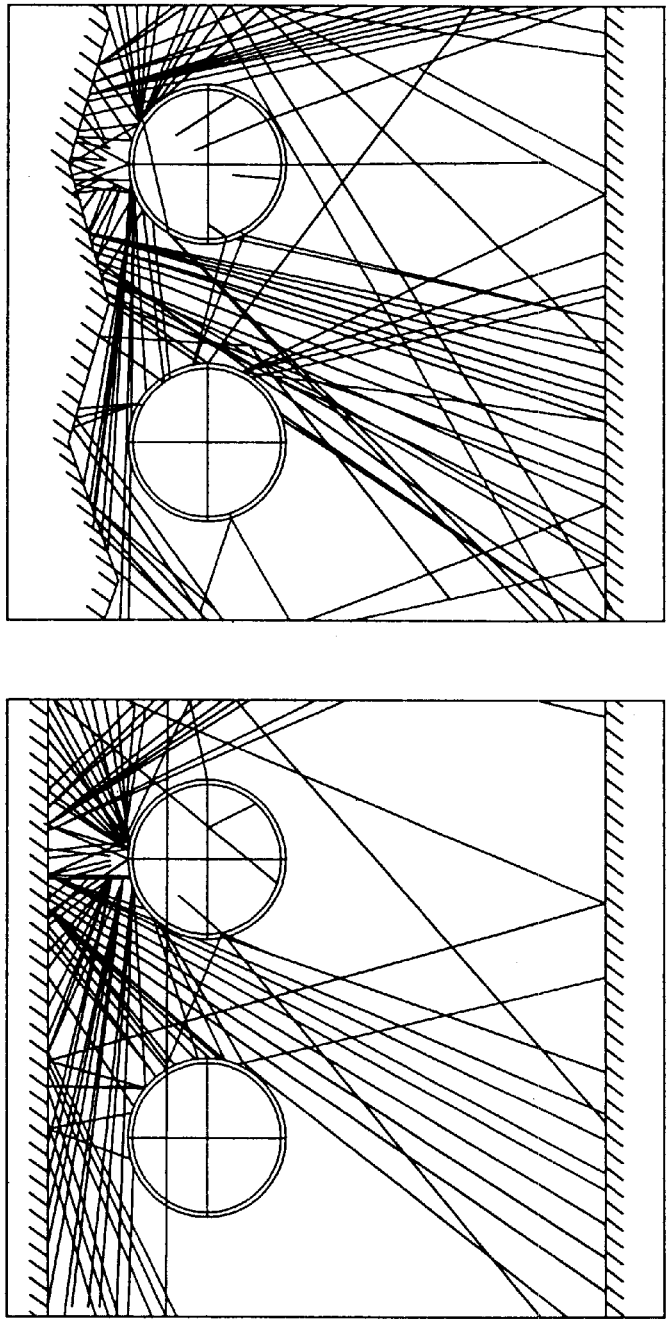
FIG. 7A is an illustration showing the mode of reflection according to a conventional flat-shaped reflective mirror.
FIG. 7B is an illustration showing the mode of reflection according to the reflective mirror shown in FIG. 6.

FIG. 7A shows the mode of reflection according to the conventional flat-shaped reflective mirror 3. FIG. 7B shows the mode of reflection according to the reflective mirror 23 of the present embodiment. In FIGS. 7A and 7B, a double circle represents a cross section of the tube wall of the low-pressure mercury lamp 4, and many straight lines represent the optical paths of the ultraviolet light emitted from a single point of the low-pressure mercury lamp 4 and reflected by the reflective mirror. Moreover, a surface shown in the lower part of FIGS. 7A and 7B is a surface of the wafer W to be irradiated.

It can be appreciated from comparison of FIG. 7A and FIG. 7B, in the conventional flat-shaped reflective mirror, the ultraviolet light emitted from an upper part of the lamp at an angle near the horizontal direction is irradiated onto the side part of the apparatus without being reflected by the reflective mirror. However, according to the corrugated reflective mirror 23 of the present embodiment, a large part of the ultraviolet light emitted at an angle heat the horizontal direction is incident on the slanting part of the protruding reflective part 23a, and is reflected in a direction toward the wafer W. Therefore, the intensity of the ;optical paths, which reach the surface of the wafer W according to the corrugated reflective mirror 23 of the present embodiment, is much higher than that of the conventional reflective mirror 3. Therefore, according to the present embodiment, a larger amount of ultraviolet light can be irradiated onto the surface of the wafer W corresponding to an area between the adjacent low-pressure mercury lamps 4 than the conventional apparatus.

Figure 8:
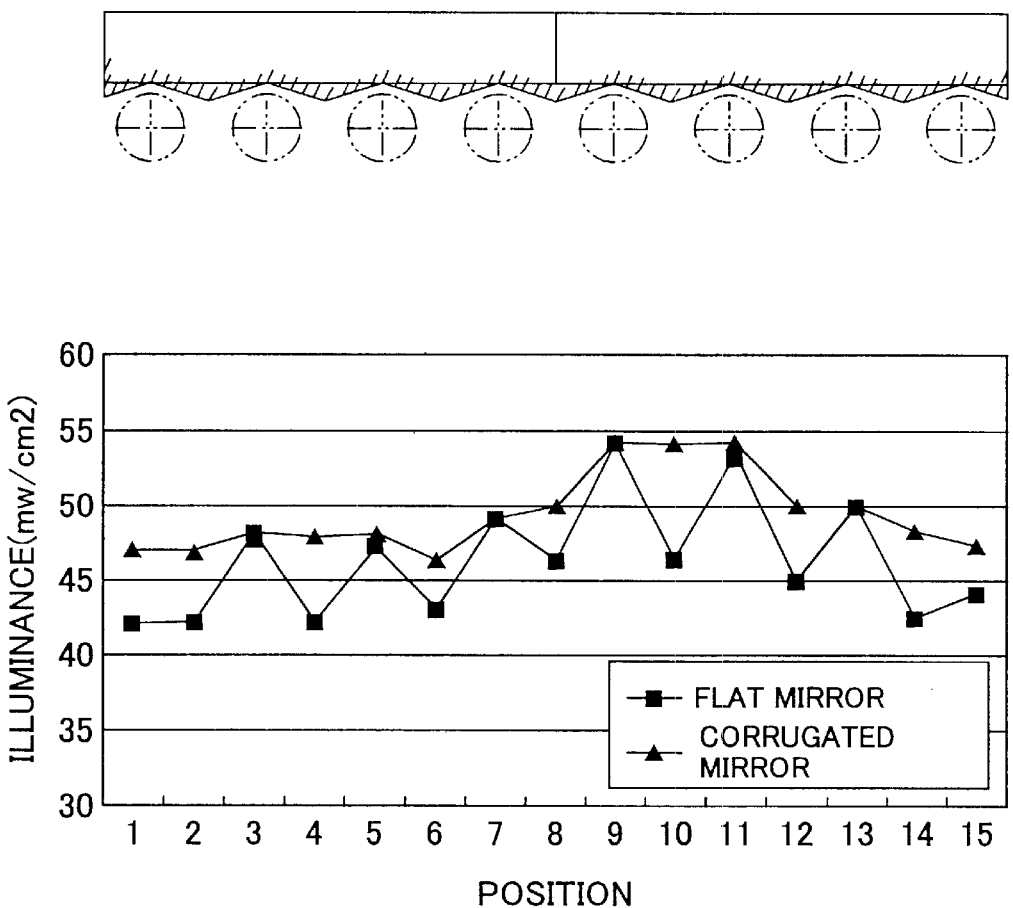
FIG. 8 is a graph showing an improvement in an intensity of illumination by a corrugated reflective mirror shown in FIG. 6.

FIG. 8 is a graph showing an improvement in the intensity of illumination by the corrugated reflective mirror 23. The horizontal axis of the graph of FIG. 8 expresses points along a direction perpendicular to the longitudinal direction of the low-pressure mercury lamps 4. The odd numbers among the numbers indicated along the horizontal axis represent positions of the irradiated surface corresponding to a middle point between the adjacent low-pressure mercury lamps 4. On the other hand, the even numbers indicate the locations on the irradiated surface corresponding to the center position of each of the low-pressure mercury lamps 4. Additionally, square dots represent an illuminance distribution when the conventional flat mirror is used. Triangular dots represent an illuminance distribution when the reflective mirror 23 according to the present embodiment is used.

As appreciated from the graph of FIG. 8, according to the conventional flat reflective mirror, the illuminance in an area corresponding to the part between the adjacent low-pressure mercury lamps 4 is lower than the illuminance at a part directly under the low-pressure mercury lamp 4, and there is variation in the illuminance distribution. On the other hand, according to the corrugated reflective mirror 23 of the present embodiment, since an ultraviolet light is efficiently reflected toward the area between the adjacent low-pressure mercury lamps 4, there is less difference between the illuminance in the area corresponding to the part between the adjacent low-pressure mercury lamps 4 and the illuminance at the part directly under the low-pressure mercury lamp 4. Thereby, compared with a flat-surface mirror, an almost uniform illuminance distribution can be obtained.

As mentioned above, since the ultraviolet light, which travels in the horizontal direction of the low-pressure mercury lamp 4, can be efficiently reflected in the direction toward the wafer W, the ultraviolet-light illuminance on the wafer W is improved by about 10%. Moreover, according to the corrugated reflective mirror 23 of the present embodiment, the ultraviolet-light irradiation can be uniformly performed over the whole wafer W, and the ultraviolet-light irradiation time, which has been decided based on a process performed on an area with a lower illuminance, can be reduced.

It should be noted that although the slanting surfaces are provided by forming a straight configuration corresponding to two sides of a rectangle in the present embodiment, the present invention is not limited to such a straight configuration, and the slanting surfaces may be curved or a top and bottom may be rounded. Moreover, although the angle of a top and bottom part is set to about 142 degrees in the present embodiment, this is an angle decided based on the arrangement of the low-pressure mercury lamps 4 and an ease of attachment and detachment of the low-pressure mercury lamps 4 at the time of replacement, and the angle may be changed if necessary.

Moreover, by combining the structure of the reflective mirror according to the first embodiment and the structure of the reflective mirror according to the second embodiment, a further uniformization of the illuminance can be attempted so as to extend the service life of the low-pressure mercury lamps 4. That is, by providing the exhaust holes show in FIG. 4 to the reflective mirror 23 shown in FIG. 6, a uniform illuminance distribution can be obtained by efficiently reflecting an ultraviolet light toward the wafer W while uniformizing the bulb temperature of the low-pressure mercury lamp 4.

Figure 9:
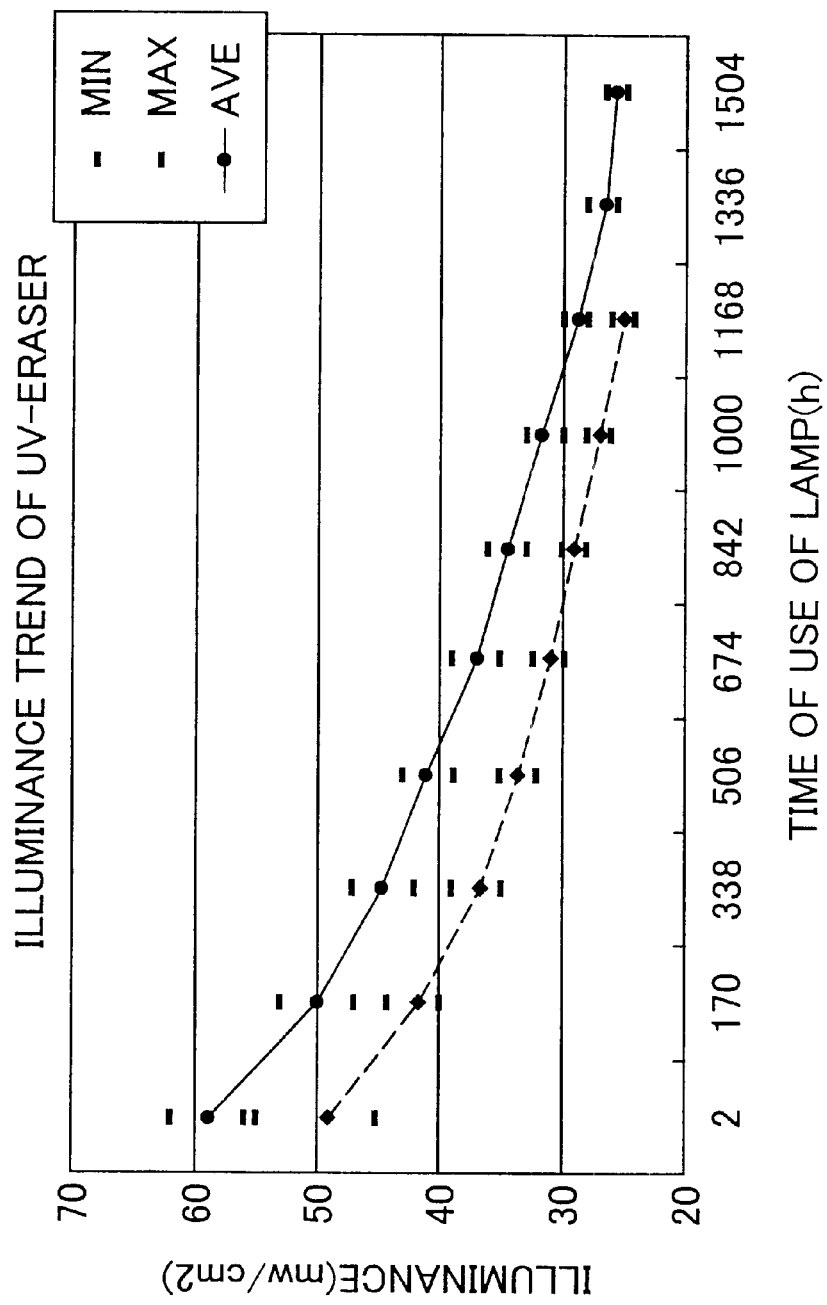
FIG. 9 is a graph showing a decrease in an illuminance by the low-pressure mercury lamp when the size of the exhaust holes of which size is sequentially changed as shown in FIG. 4 are provided to the corrugated reflected mirror.

FIG. 9 is a graph showing a decrease in the illuminance by the low-pressure mercury lamp when the exhaust holes of which size is sequentially changed as shown in FIG. 4 are provided to the corrugated reflected mirror 23. A dotted line shows a decrease in the illuminance when the conventional reflective mirror shown in FIG. 3 is used. Since the illuminance of the low-pressure mercury lamp 4 falls as the time of use, it is determined generally that the service life is terminated when the illuminance reaches a certain degree, and the lamp is replaced with new one.

Although a plurality of low-pressure mercury lamps, for example, 20 pieces, are incorporated into one ultraviolet-light irradiation apparatus, when a replacement operation is performed, all of the lamps are replaced in consideration of time and effort. A low-pressure mercury lamp is an expensive lamp, which costs about 60,000 yen, and if it replaced with new one frequently, it will influence the manufacturing cost of a semiconductor device.

Here, it is assumed that the end of the service life of the low-pressure mercury lamp 4 is a time when the illuminance falls to 25 mW/cm$^2$. When the conventional reflective mirror shown in FIG. 3 is used, it is determined from the graph of FIG. 9 that the service life is about 1,100 hours. On the other hand, when the corrugated reflective mirror having the exhaust holes of which size is sequentially changed is used, it is determined from the graph of FIG. 9 that the service life is about 1,500 hours. This means that the service life is extended by 400 hours (36%). Therefore, the time interval of replacement of the low-pressure mercury lamp 4 as an consumable item can be greatly extended, which results in reduction of manufacturing cost of semiconductor devices manufactured by the ultraviolet-light irradiation apparatus. Additionally, according to the ultraviolet-light irradiation apparatus using the reflective mirror according to the present invention, the cost spent on the low-pressure mercury lamp can be reduced. Moreover, an ultraviolet-light irradiation time can be shortened and a throughput can be improved. Furthermore, the manufacturing cost of semiconductor devices such as a flash memory can be reduced.

It should be noted that although the ultraviolet-light irradiation apparatus according to the above-mentioned embodiments is an apparatus, which irradiates a vacuum ultraviolet light having a wavelength of 254 nm, the present invention is applicable also to a ultraviolet-light irradiation apparatus which carries out a process by irradiating an ultraviolet light having a different wave length. For example, the present invention is applicable to an ultraviolet-light irradiation apparatus for irradiating an ultraviolet light having a wavelength of 365 nm onto a resist so as to cure the resist. Moreover, the present invention is applicable to an ultraviolet-light irradiation apparatus for carrying out optical cleaning of an organic matter by irradiating an ultraviolet light having a wavelength of 183 nm. Moreover, although the ultraviolet-light irradiation apparatus according to the present invention irradiates an ultraviolet light onto an object to be irradiated such as a wafer W so as to carry out various processes, the present invention also includes the approach of performing such a process.

For example, the ultraviolet-light irradiation apparatus according to the present invention can be used to cure a resist, which is composed of an ultraviolet-light curing resin applied on a wafer. The ultraviolet-light curing resist is widely used as a mask for forming a semiconductor element on a wafer. According to the resist curing method using the ultraviolet-light irradiation apparatus according to the present invention, since an ultraviolet light having a uniform intensity can be irradiated over an entire surface of a plurality of wafers, the resist can be efficiently cured for a short curing time.

Moreover, the ultraviolet-light irradiation apparatus according to the present invention is applicable also to optical cleaning of organic matters adhering on a wafer. That is, an unnecessary organic matter is decomposed and removed by irradiating an ultraviolet light onto a wafer. According to the optical cleaning method of an organic matter using the ultraviolet-light irradiation apparatus according to the present invention, an ultraviolet light having a uniform intensity can be irradiated over an entire surface of a plurality of wafers, thereby decomposing the organic matter for a short time.

The present invention is not limited to the specifically disclosed embodiments, and variations and modifications may be made without departing from the scope of the present invention.

The present application is based on Japanese priority application No. 2001-278591 filed on Sep. 13, 2001, the entire contents of which area hereby incorporated by reference.

What is claimed is:

1. An ultraviolet-light irradiation apparatus comprising:
   a plurality of low-pressure mercury lamps arranged in parallel;
   a placement stage provided under the low-pressure mercury lamps so that an object onto which an ultraviolet light emitted by the low-pressure mercury lamps is irradiated is placed on the placement stage;
   a reflective mirror arranged above the low-pressure mercury lamps so as to reflect the ultraviolet light emitted by the low-pressure mercury lamps; and
   an exhaust passage defined by the reflective mirror, the exhaust passage suctioning air around the low-pressure mercury lamps and exhausting the suctioned air to outside,
   wherein said reflective mirror has a plurality of openings arranged along a longitudinal direction of the low-pressure mercury lamps, and some of the openings have a size different from a size of other openings; and
   wherein said exhaust passage has a closed end and a suction end opposite to the closed end along a longitudinal direction thereof so as to suction air through said openings by exhausting the air from the suction end, and the size of said openings gradually increases from the suction end toward the closed end of said exhaust passage.

2. The ultraviolet-light irradiation apparatus as claimed in claim 1, wherein said reflective mirror is divided into a plurality of areas along the longitudinal direction of said low-pressure mercury lamps, and an opening located in one of the areas closer to the closed end of said exhaust passage is larger than an opening in an area closer to the suction end of said exhaust passage.

3. The ultraviolet-light irradiation apparatus as claimed in claim 1, wherein an interval of said openings locally differs along the longitudinal direction of said low-pressure mercury lamps.

4. An ultraviolet-light irradiation apparatus comprising:
   a plurality of low-pressure mercury lamps arranged in parallel;
   a placement stage provided under the low-pressure mercury lamps so that an object onto which an ultraviolet light emitted by the low-pressure mercury lamps is irradiated is placed on the placement stage;
   a reflective mirror arranged above the low-pressure mercury lamps so as to reflect the ultraviolet light emitted by the low-pressure mercury lamps; and
   an exhaust passage defined by the reflective mirror, the exhaust passage suctioning air around the low-pressure mercury lamps and exhausting the suctioned air to outside,
   wherein said reflective mirror has a plurality of openings having the same size and arranged along a longitudinal direction of the low-pressure mercury lamps, and an interval of said openings locally differs along the longitudinal direction of said low-pressure mercury lamps.

5. An ultraviolet-light irradiation apparatus comprising:
   a plurality of low-pressure mercury lamps arranged in parallel;
   a placement stage provided under the low-pressure mercury lamps so that an object onto which an ultraviolet light emitted by the low-pressure mercury lamps is irradiated is placed on the placement stage; and
   a reflective mirror arranged above the low-pressure mercury lamps so as to reflect the ultraviolet light emitted by the low-pressure mercury lamps,
   wherein said reflective mirror has a protruding reflective part protruding into a space between the adjacent low-pressure mercury lamps; and further comprising an exhaust passage defined by the reflective mirror, the exhaust passage suctioning air around the low-pressure mercury lamps and exhausting the suctioned air to outside, wherein said reflective mirror has a plurality of openings arranged along a longitudinal direction of the low-pressure mercury lamps, and said exhaust passage has a closed end and a suction end opposite to the closed end along a longitudinal direction thereof so as to suction air through said openings by exhausting the air from the suction end, the size of said openings gradually increasing from the suction end toward the closed end of said exhaust passage.

6. The ultraviolet-light irradiation apparatus as claimed in claim 5, wherein the protruding reflective part of said reflective mirror has an outer configuration defined by two sides of a triangle having a top located in the middle between the adjacent low-pressure mercury lamps.

7. The ultraviolet-light irradiation apparatus as claimed in claim 6, wherein said reflective mirror is made of a metal plate, and said protruding reflective part is formed by bending the metal plate.

8. An ultraviolet light irradiation apparatus as claimed in claim 5 wherein said openings have the same size, and wherein an interval between said openings gradually decreases from the suction end toward the closed end of said exhaust passage.

9. The ultraviolet-light irradiation apparatus as claimed in claim 5 wherein said reflective mirror is divided into a plurality of areas along the longitudinal direction of said low-pressure mercury lamps, and said openings located in an area closer to the closed end of said exhaust passage are larger than openings in an area closer to the suction end of said exhaust passage.

10. The ultraviolet-light irradiation apparatus as claimed in claim 1, configured and arranged to irradiate the ultraviolet light onto the object to be irradiated so as to cure a resist applied to the object to be irradiated.

11. The ultraviolet-light irradiation apparatus as claimed in claim 4, configured and arranged to irradiate the ultraviolet light onto the object to be irradiated so as to cure a resist applied to the object to be irradiated.

12. The ultraviolet-light irradiation apparatus as claimed in claim 5, configured and arranged to irradiate the ultraviolet light onto the object to be irradiated so as to cure a resist applied to the object to be irradiated.

13. The ultraviolet-light irradiation apparatus as claimed in claim 1, configured and arranged to irradiate the ultraviolet light onto the object to be irradiated so as to carry out optical cleaning of an organic matter on the object to be irradiated.

14. The ultraviolet-light irradiation apparatus as claimed in claim 4, configured and arranged to irradiate the ultraviolet light onto the object to be irradiated so as to carry out optical cleaning of an organic matter on the object to be irradiated.

15. The ultraviolet-light irradiation apparatus as claimed in claim 5, configured and arranged to irradiate the ultraviolet light onto the object to be irradiated so as to carry out optical cleaning of an organic matter on the object to be irradiated.

16. A resist curing method comprising:
generating an ultraviolet light by a plurality of low-pressure mercury lamps arranged in parallel;
reflecting the ultraviolet light emitted by the low-pressure mercury lamps toward an object placed on a placement stage by a reflective mirror located above the low-pressure mercury lamps so as to cure a resist on the object to be irradiated; and
suctioning air around the low-pressure mercury lamps into an exhaust passage defined by the reflective mirror and exhausting the suctioned air to outside, the air being suctioned through a plurality of openings formed in said reflective mirror and arranged along a longitudinal direction of the low-pressure mercury lamps, some of the openings having sizes different from sizes of other openings; and
wherein said exhaust passage has a closed end and a suction end opposite to the closed end along a longitudinal direction thereof so as to suction air through said openings by exhausting the air from the suction end, and the size of said openings gradually increases from the suction end toward the closed end of said exhaust passage.

17. A resist curing method comprising:
generating an ultraviolet light by a plurality of low-pressure mercury lamps arranged in parallel;
reflecting the ultraviolet light emitted by the low-pressure mercury lamps toward an object placed on a placement stage by a reflective mirror located above the low-pressure mercury lamps so as to cure a resist on the object to be irradiated; and
suctioning air around the low-pressure mercury lamps into an exhaust passage defined by the reflective mirror and exhausting the suctioned air to outside, the air being suctioned through a plurality of openings having the same size and formed in said reflective mirror and arranged along a longitudinal direction of the low-pressure mercury lamps, an interval of said openings locally differing along the longitudinal direction of said low-pressure mercury lamps.

18. A resist curing method, comprising:
generating an ultraviolet light by a plurality of low-pressure mercury lamps arranged in parallel; and
reflecting the ultraviolet light emitted by the low-pressure mercury lamps toward an object placed on a placement stage by a protruding reflective part of a reflective mirror so as to cure a resist on the object to be irradiated, the protruding reflective part protruding into a space between the adjacent low-pressure mercury lamps, and
suctioning air around the low-pressure mercury lamps into an exhaust passage defined by the reflective mirror and exhausting the suctioned air to outside, the air being suctioned through a plurality of openings formed in said reflective mirror and arranged along a longitudinal direction of the low-pressure mercury lamps, and wherein an interval between said openings gradually decreases from the suction end toward the closed end of said exhaust passage.

19. An optical cleaning method of an organic matter, comprising:
generating an ultraviolet light by a plurality of low-pressure mercury lamps arranged in parallel;
reflecting the ultraviolet light emitted by the low-pressure mercury lamps toward an object placed on a placement stage by a reflective mirror located above the low-pressure mercury lamps so as to optically remove the organic matter on the object to be irradiated; and
suctioning air around the low-pressure mercury lamps into an exhaust passage defined by the reflective mirror and exhausting the suctioned air to outside, the air being suctioned through a plurality of openings formed in said reflective mirror and arranged along a longitudinal direction of the low-pressure mercury lamps, some of the openings having sizes different from sizes of other openings.

20. An optical cleaning method of an organic matter, comprising:
generating an ultraviolet light by a plurality of low-pressure mercury lamps arranged in parallel;
reflecting the ultraviolet light emitted by the low-pressure mercury lamps toward an object placed on a placement stage by a reflective mirror located above the low-pressure mercury lamps so as to optically remove the organic matter on the object to be irradiated; and
suctioning air around the low-pressure mercury lamps into an exhaust passage defined by the reflective mirror and exhausting the suctioned air to outside, the air being suctioned through a plurality of openings having the same size and formed in said reflective mirror and arranged along a longitudinal direction of the low-pressure mercury lamps, an interval of said openings locally differing along the longitudinal direction of said low-pressure mercury lamps.

21. An optical cleaning method of an organic matter, comprising:

generating an ultraviolet light by a plurality of low-pressure mercury lamps arranged in parallel; and reflecting the ultraviolet light emitted by the low-pressure mercury lamps toward an object placed on a placement stage by a protruding reflective part of a reflective mirror so as to optically remove the organic matter on the object to be irradiated, the protruding reflective part protruding into a space between the adjacent low-pressure mercury lamps, and suctioning air around the low-pressure mercury lamps into an exhaust passage defined by the reflective mirror and exhausting the suctioned air to outside, the air being suctioned through a plurality of openings formed in said reflective mirror and arranged along a longitudinal direction of the low-pressure mercury lamps, and wherein an interval between said openings gradually decreases from the suction end toward the closed end of said exhaust passage.

* * * * *